United States Patent [19]

Yamanaka et al.

[11] Patent Number: 5,034,797
[45] Date of Patent: Jul. 23, 1991

[54] SEMICONDUCTOR MEMORY DEVICES HAVING STACKED POLYCRYSTALLINE SILICON TRANSISTORS

[75] Inventors: Toshiaki Yamanaka, Hoya; Yoshio Sakai, Kanagawa; Takashi Hashimoto, Hachioji; Takashi Nishida; Satoshi Meguro, both of Tokyo; Shuji Ikeda; Eiji Takeda, both of Koganei, all of Japan

[73] Assignee: Hitachi, Ltd., Tokyo, Japan

[21] Appl. No.: 497,182

[22] Filed: Mar. 22, 1990

[30] Foreign Application Priority Data

Mar. 24, 1989 [JP] Japan .................................. 1-70683

[51] Int. Cl.⁵ .......................................... H01L 27/02
[52] U.S. Cl. ...................................... 357/42; 357/51; 365/156
[58] Field of Search .................... 365/154, 182, 156; 357/23.4, 23.5, 42, 41, 51, 59; 307/304, 279

[56] References Cited

U.S. PATENT DOCUMENTS

| | | | |
|---|---|---|---|
| 4,481,524 | 11/1984 | Tsujide | 357/42 |
| 4,609,835 | 9/1986 | Sakai et al. | 307/450 |
| 4,633,438 | 12/1986 | Kume et al. | 365/51 |
| 4,774,203 | 9/1988 | Ikeda et al. | 437/52 |
| 4,782,373 | 11/1988 | Lund et al. | 357/23.9 |
| 4,814,841 | 3/1989 | Masuoka et al. | 357/23.7 |
| 4,894,801 | 1/1990 | Saito et al. | 365/154 |
| 4,918,510 | 4/1990 | Pfiester | 357/42 |

FOREIGN PATENT DOCUMENTS 63-137468 6/1988 Japan .................................. 357/42

Primary Examiner—Jerome Jackson, Jr.
Assistant Examiner—Donald L. Morin
Attorney, Agent, or Firm—Antonelli, Terry, Stout & Kraus

[57] ABSTRACT

A semiconductor device having a CMIS structure for forming a static random access memory is disclosed which device can increase the packing density of the memory and reduce the stand-by power thereof. In this semiconductor device, a first MISFET of a first conductivity type is formed on and a substrate, a second MISFET of a second conductivity type is formed over the first MISFET with a first insulating film therebetween to form a stacked CMIS structure. The second MISFET is made up of a first conductive film, a second insulating film and a second conductive film, with the source, drain and channel regions of the second MISFET being formed in the first conductive film. A first resistive drain region is formed between the channel and drain regions of the first conductive film so that an impurity of the second conductivity type is contained in the first resistive drain region at a lower concentration than in the drain region, or the first resistive drain region is substantially undoped. The first resistive drain region is disposed over the gate electrode of the first MISFET, and the gate insulating film and gate electrode of the second MISFET are formed of the second insulating film and the second conductive film, respectively. In a case where a semiconductor memory device having a static random access memory cell which is provided with a flip-flop circuit of the stacked CMIS type, is formed, a pair of first MISFET's and a pair of third MISFET's of the first conductivity type are formed on the substrate, and the second MISFET is formed on one MISFET of the first MISFET's and the third MISFET's.

31 Claims, 10 Drawing Sheets

SEMICONDUCTOR MEMORY DEVICES HAVING STACKED POLYCRYSTALLINE SILICON TRANSISTORS

BACKGROUND OF THE INVENTION

The present invention relates to semiconductor devices, and more particularly to a semiconductor integrated circuit which includes a multiplicity of CMIS (complementary metal-insulator-semiconductor) transistors each made up of a first MISFET (metal-insulator-semiconductor field effect transistor) of a first conductivity type and a second MISFET of a second conductivity type. In more detail, the present invention relates to a semiconductor memory device suited to be used as a static random access memory which is high in packing density and low in stand-by power.

In a conventional static random access memory cell of the CMIS type, as shown in FIG. 12, two N-channel drive MISFET's $T_1$ and $T_2$ and two P-channel load MISFET's $T_3$ and $T_4$ are connected so as to form two inverter circuits, which are coupled with each other in cross connection to form a flip-flop circuit. Further, N-channel transfer MISFET's $T_5$ and $T_6$ are connected to storage nodes $N_1$ and $N_2$ of the flip-flop circuit, respectively. One and the other ends of the flip-flop circuit are applied with a power supply voltage $V_{CC}$ and a ground potential, respectively. Data lines 6 and 6' are connected to the drains of the transfer MISFET's $T_5$ and $T_6$, respectively, and the common gate line of the transfer MISFET's $T_5$ and $T_6$ is used as a word line 3. As is well known, such a static random access memory cell is operated in the following manner. That is, the word line 3 is activated to store a logical value "1" or "0" (that is, high or low logical value) in a storage node $N_1$ or $N_2$, or to read out the state of the storage node. The static random access memory cell provided with such a CMIS circuit has a feature that only the leakage current of MISFET is generated in a stand-by period, and thus stand-by power is small.

A semiconductor memory device having the above memory cell at a high packing density is described in, for example, an article entitled "Characteristics and Three-Dimensional Integration of MOSFET's in Small-Grain LPCVD Polycrystalline Silicon" (IEEE, Trans. Electron Devices, Vol. ED-32, No. 2, 1985, pages 258 to 281). In this semiconductor memory device, the P-channel load MOSFET's (metal-oxide-semiconductor field effect transistors) of the flip-flop circuit are formed in such a manner that a polycrystalline silicon film for the load MOSFET's is piled on the N-channel drive MOSFET's of the flip-flop circuit. FIGS. 10 and 11 are plan and sectional views showing a static random access memory cell which is described in the above-referred article, respectively. That is, FIG. 11 is a sectional view taken along the line XI—XI of FIG. 10. Referring to FIGS. 10 and 11, at least the upper and side surfaces of the gate electrode 4b of an N-channel drive MOSFET formed in a silicon substrate are coated with a thin silicon oxide film 13, and a polycrystalline silicon film is formed on the silicon oxide film 13. The source region 5c, drain region 5b and channel region 5e of a P-channel load MOSFET are formed in the polycrystalline silicon film. The channel region 5e is formed so that the gate electrode 4b of the N-channel drive MOSFET is placed under the channel region 5e. Thus, the gate electrode 4b of the N-channel drive MOSFET can also be used as the gate electrode of the P-channel load MOSFET, and the silicon oxide film 13 is used as the gate insulating film of the P-channel load MOSFET. In more detail, the drive MOSFET's of the flip-flop circuit are made up of an N-type region 1e for forming a common source region, N-type regions 1c and 1d for forming drain regions, and gate electrodes 4b and 4c. The gate electrodes 4b and 4c are connected to the N-type regions 1c and 1d through contact holes 2a and 2b, respectively. Further, the N-type regions 1c and 1d for forming the drain regions of the drive MOSFET's are also used as the source regions of the N-channel transfer MOSFET's connected to the flip-flop circuit, and thus are used as the storage nodes of the flip-flop circuit. The N-channel transfer MOSFET's are made up of the N-type regions 1c and 1d for forming the source regions, a common gate electrode 4a, and N-type regions 1a and 1b for forming drain regions. The N-type regions 1a and 1b are connected to aluminum electrodes 8a and 8b through contact holes 7a and 7b, respectively. The common gate electrode 4a is used as a word line, and the aluminum electrodes 8a and 8b are used as data lines. Further, a contact hole 7c is provided on the drain region 5a of one P-channel load MOSFET and the gate electrode 4b of one N-channel drive MOSFET so that the drain region 5a and the gate electrode 4b are both exposed, and the drain region 5a is connected to the gate electrode 4b through an aluminum electrode 8c fulling up the contact hole 7c. Similarly, another contact hole 7d is provided on the drain region 5b of the other P-channel load MOSFET and the gate electrode 4c of the N-channel drive MOSFET so that the drain region 5b and the gate electrode 4c are both exposed, and the drain region 5b is connected to the gate electrode 4c through an aluminum electrode 8d filling up the contact hole 7d. It is to be noted that the drain regions 5a and 5b of the P-channel load MOSFET's are formed of a low-resistive polycrystalline silicon film which is heavily doped with a P-type impurity. Further, the common source region 5c of the P-channel load MOSFET's is formed of the low-resistive polycrystalline silicon film which is heavily doped with the P-type impurity, and is applied with a power supply voltage $V_{cc}$. The channel regions 5d and 5e of the P-channel load MOSFET's are placed over the gate electrodes 4c and 4b, respectively.

SUMMARY OF THE INVENTION

The present inventors have studied the above-mentioned prior art, and found the following problems. In this prior art, the gate electrode of an N-channel drive MOSFET formed in the silicon substrate is also used as the gate electrode of the P-channel load MOSFET formed over the N-channel drive MOSFET. Hence, it is required to dispose the channel region of the P-channel load MOSFET over the gate electrode of the N-channel drive MOSFET. Accordingly, the degree of freedom in layout is small, and it is difficult to reduce the area of one memory cell in a great degree.

Further, in order to form a thin insulating film on the gate electrode of the N-channel drive MOSFET, the material of the gate electrode is limited. That is, it is undesirable to form a thin insulating film on refractory metals such as molybdenum and tungsten or the silicides of these metals, since the insulating film is chemically unstable. Thus, low resistive materials such as molybdenum, tungsten and silicides thereof cannot be used for forming the gate electrode.

Further, owing to a trap state in the grain boundary of polycrystalline silicon film and the effect of a gate voltage to the polycrystalline silicon film the P-channel load MOSFET formed in the polycrystalline silicon film has a large leakage current. Thus, the P-channel load MOSFET is larger in leakage current than the N-channel drive MOSFET formed in the silicon substrate. Accordingly, in a case where the above P-channel MOSFET is used as the load element of a memory cell, the leakage current of the memory cell is increased. Thus, it is not proper to use such a memory cell as the memory cell of a static random access memory which is high in packing density and very low in stand-by power.

According to the present invention, there is provided a semiconductor device with a stacked CMIS structure obtained by forming a second MISFET of a second conductivity type on a first MISFET of a first conductive type, in which device the first MISFET of the first conductivity type is formed in a substrate, the second MISFET of the second conductivity type is formed over the first MISFET with a first insulating film therebetween, the second MISFET includes a first conductive film for forming the source, drain and channel regions of the second MISFET, a second insulating film for forming the gate insulating film of the second MISFET, and a second conductive film for forming the gate electrode of the second MISFET, the first conductive film, the second insulating film and the second conductive film are deposited so as to form a laminate, a first resistive drain region is formed between the channel and drain regions of the first conductive layer so that an impurity of the second conductivity type is contained in the first resistive drain region at a lower concentration than in the drain region, or the first resistive drain region is substantially undoped, and the first resistive drain region is disposed over the gate electrode of the first MISFET.

In a case where a semiconductor memory device having a static random access memory cell which is provided with a flip-flop circuit of the above CMIS structure, is formed, a pair of first MISFET's of the first conductivity type and a pair of third MISFET's of the first conductivity type are formed in the substrate, and the second MISFET of the second conductivity type is formed over one MISFET of the first MISFET's and the third MISFET's.

In a preferred embodiment of a semiconductor memory device according to the present invention, the first MISFET's are operated as drive MISFET's, the third MISFET's are operated as transfer MISFET's, and the second MISFET is operated as a load MISFET.

It is preferable to form the first and second conductive films of a polycrystalline silicon film (hereinafter referred to as "polysilicon film"), and it is preferable to dope the first conductive film with a P-type impurity.

Further, it is preferable that the gate electrode of the first MISFET is electrically connected to at least a portion of the first conductive film of the second MISFET, and it is preferable to form one of the first and second conductive films over the other conductive film with the second insulating film therebetween.

In the second MISFET including the first and second polysilicon films, the first resistive drain region weakens the gate electric field at an end of the drain region. Thus, the generation of a current is suppressed, and a leakage current is reduced. Further, since the first resistive drain region is disposed on the gate electrode of the first MISFET, the resistance of the first resistive drain region is modulated by a gate voltage applied to the gate electrode of the first MISFET, and thus a reduction in drain current of the second MISFET due to the first resistive drain region can be prevented.

Further, when the second MISFET's are used as the load elements of the flip-flop circuit of a static random access memory cell, the first resistive drain region of the first conductive layer of the second MISFET connected to a storage node having a high potential level has large conductivity (that is, small resistance). Accordingly, even when the power supply voltage is reduced, information stored in the memory cell is never reversed by the first resistive drain region. Moreover, in this case, the leakage current of the memory cell is reduced by the first resistive drain region.

It is accordingly an object of the present invention to provide a semiconductor device, in which a stacked CMIS circuit can be formed without being restricted by the position of a gate electrode and the material for making the gate electrode.

It is another object of the present invention to provide a semiconductor device including a static random access memory cell which is provided with a flip-flop circuit of a stacked CMIS structure and is small in leakage current.

It is a further object of the present invention to provide a semiconductor device which is small in area.

It is a different object of the present invention to provide a semiconductor device which is small in leakage current.

It is an additional object of the present invention to provide a semiconductor device which can be operated on a low voltage.

It is still another object of the present invention to provide a semiconductor device which is excellent in immunity to the soft error due to $\alpha$-rays.

It is still a further object of the present invention to provide a static random access memory device of the CMIS type which device is small in area and leakage current, excellent in immunity to the soft error due to $\alpha$-rays, and operable on a low voltage.

These and other objects and many of the attendant advantages of this invention will be readily appreciated and becomes better understood by reference to the following detailed description when considered in connection with the accompanying drawings.

DESCRIPTION OF THE PREFERRED EMBODIMENTS

Embodiment-1

Figure 1:
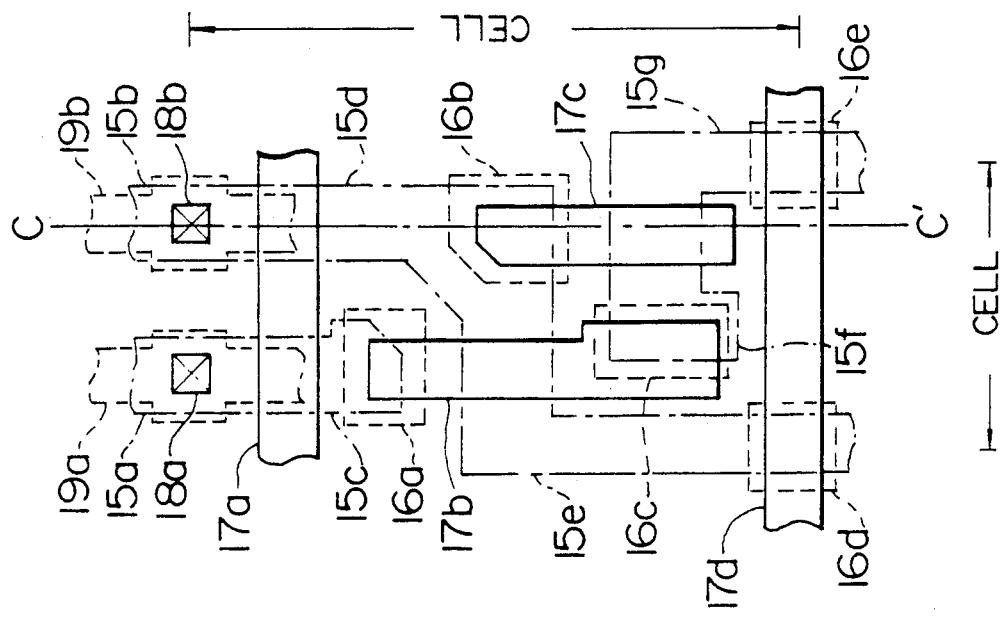
FIGS. 1A, 1B, 7A and 7B are plan views showing embodiments of the present invention.
Figure 2:
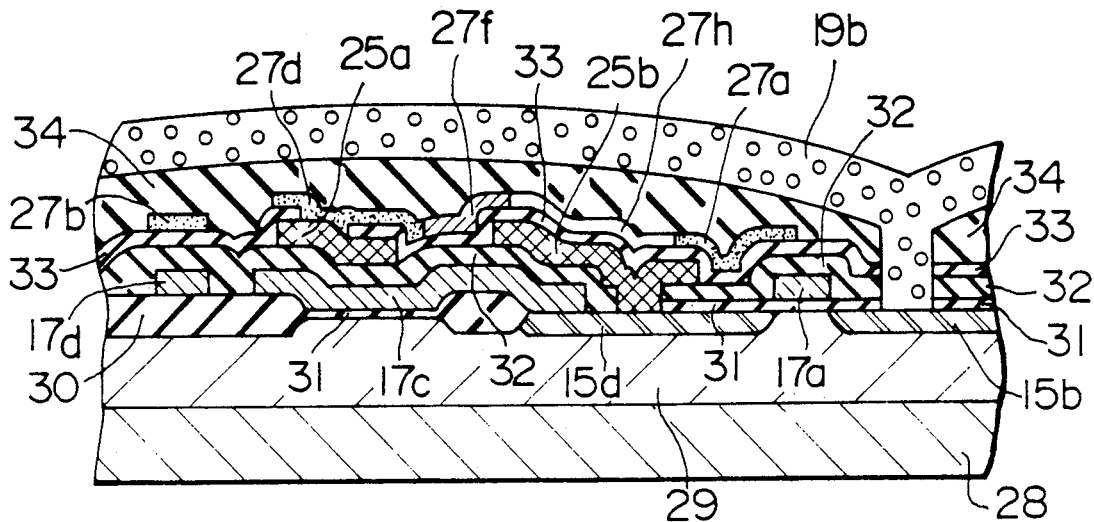
FIGS. 2, 5A to 5F, 6 and 8 are sectional views showing embodiments of the present invention.

FIGS. 1A and 1B are plan views showing a first embodiment of a static random access memory cell according to the present invention, and FIG. 2 is a sectional view taken along the line C-C' of FIGS. 1A and 1B. In more detail, FIG. 1A shows the arrangement of N-channel drive MOSFET's, N-channel transfer MOSFET's, a word line and data lines, and FIG. 1B shows the arrangement of P-channel load MOSFET's and power supply lines.

In the drawings, reference symbols 1a to 1e and 15a to 15g designate N-type regions, 2a, 2b, 7a to 7d, 16a to 16e, 20a, 20b, 22a, 22b, 24a, 24b, 26a and 26b contact holes, 3 a word line, 4a to 4c and 17a to 17d gate electrodes, 5a and 5b the drain regions of P-channel polysilicon MOSFET's, 5c the common source region of the P-channel polysilicon MOSFET's, 5d and 5e the channel regions of the P-channel polysilicon MOSFET's, 6 and 6' data lines, 8a to 8d, 19a and 19b aluminum electrodes, 9 and 28 N-type silicon substrates, 10 and 29 P-type well, 11 and 30 field oxide films, 12 and 31 gate oxide films, 14, 32 and 34 silicon oxide (SiO$_2$) films, 13 and 33 insulating films, 21a, 21b, 25a, 25b and 40b the gate electrodes of P-channel polysilicon MOSFET's, 23a, 23b, 27a, 27b, 39a and 39b the source regions of the P-channel polysilicon MOSFET's, 23c, 23d, 27g, 27h and 39h the channel regions of the P-channel polysilicon MOSFET's, 23h, 23g, 27c, 27d and 39d the drain regions of the P-channel polysilicon MOSFET's, 23e, 23f, 27e, 27f and 39d resistive drain regions, 35 and 37 photoresist layers, and 36 and 38 boron ions.

Referring now to FIGS. 1A, 1B and 2, a pair of N-channel drive MOSFET's and a pair of N-channel transfer MOSFET's are formed in a P-type well (namely, P-type island region) 29 which is formed in an N-type silicon substrate 28. The gate electrodes 17c of one of the N-channel drive MOSFET's is connected to the drain region (that is, N-type region) 15d of the other drive MOSFET through the contact hole 16b, and the gate electrode 17b of the other drive MOSFET is connected to the drain region (namely, N-type region) 15f of one drive MOSFET through a contact hole 16c. The gate electrodes 17b and 17c are made of one of ordinary gate materials such as polysilicon doped heavily with an N-type impurity, a refractory metal (for example, tungsten or molybdenum), and the silicide of a refractory metal. Further, the gate electrodes 17b and 17c may be formed of a composite film, for example, a polycide film including a silicon film and a silicide film. The N-type regions 15e and 15g which are used as the source regions of the drive MOSFET's, are connected to a film 17d through contact holes 16d and 16e, respectively. The film 17d is a portion of a conductive film for forming the gate electrodes 17b and 17c, and is separated from the gate electrodes 17b and 17c.

Meanwhile, P-channel load MOSFET's are formed on a silicon oxide (SiO$_2$) film 32 which lies on the N-channel drive MOSFET's. In more detail, the gate electrodes 25a and 25b are formed of a second polysilicon film formed on the silicon oxide film 32, a thin insulating film 33 is used as the gate insulating film of the P-channel load MOSFET's, the source region 27a, drain region 27d and channel region 27h of a P-channel load MOSFET are formed in a third polysilicon layer, and the resistive drain region 27f is further formed between the drain region 27d and channel region 27h of the third polysilicon layer. It is to be noted that a first polysilicon film is used for forming the gate electrodes 17b and 17c.

Figure 3:
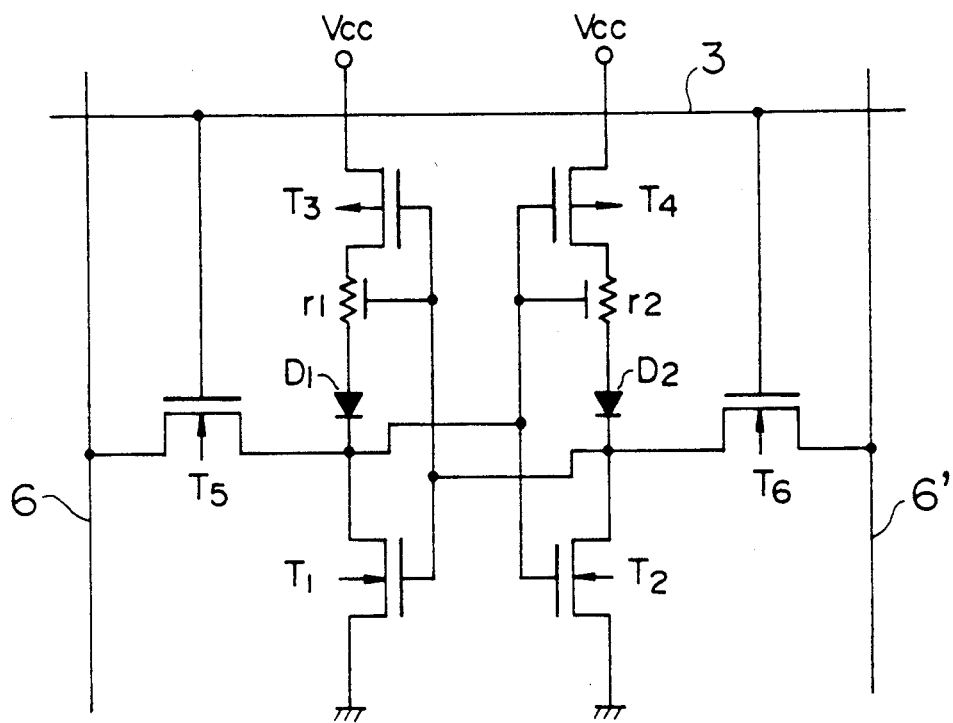
FIGS. 3, 4 and 9 are circuit diagrams showing the equivalent circuits of embodiments of the present invention.

The present embodiment will be explained below in more detail, with reference to FIGS. 1A, 1B, 2 and 3. Referring to FIGS. 1A, 1B and 2, the N-type region 15f which is one storage node of the flip-flop circuit and is used as the drain region of one of the drive MOSFET's, is connected to the N-type region 15c which is used as the drain region of one of the transfer MOSFET's, through the contact holes 16c and 16a and the gate electrode 17b. Further, the N-type region 15f is connected to the gate electrode 25a of one of the P-channel load MOSFET's, through a contact hole 24a formed in the silicon oxide film 32 at a position on the N-type region 15f or the gate electrode 17b connected thereto. As mentioned above, the gate electrode 25a is formed of the second polysilicon film. The N-type region 15d which is the other storage node of the flip-flop circuit and is used as the drain region of the other drive MOSFET, is also used as the source region of the other transfer MOSFET, and is connected to the gate electrode 25b of the other load MOSFET through a contact hole 24b which is formed in the silicon oxide film 32 at a position on the N-type region 15d or the gate electrode 17c connected thereto. The gate electrode 25b is formed of the second polysilicon layer. The drain region 27c of one load MOSFET is formed in the third polysilicon film, and is connected to the gate electrode 25b of the other load MOSFET through the contact hole 26b which is formed in the insulating film 33. Similarly, the drain region 27d of the other load MOSFET is formed in the third polysilicon film, and is connected to the gate electrode 25a of one load MOSFET through the contact hole 26a which is formed in the insulating film 33. Further, the resistive drain regions 27e and 27f which are contiguous to the channel regions 27g and 27h, respectively, are formed in the third polysilicon film, and are disposed over the gate electrodes 17b and 17c of the drive MOSFET's, respectively. Thus, the equivalent circuit of FIG. 3 is formed by the present embodiment. The source regions 27a and 27b of the load MOSFET's are also used as power supply lines in a memory device.

Further, contact holes 18a and 18b are formed in the insulating films 31, 32, 33 and 34 at a position on the drain (or source) region 15a of one transfer MOSFET and at a position on the drain (or source) region 15b of the other transfer MOSFET, respectively. The aluminum electrodes 19a and 19b are connected to the N-type regions 15a and 15b through the contact holes 18a and 18b, respectively, to be used as the data lines 6 and 6'.

Figure 4:
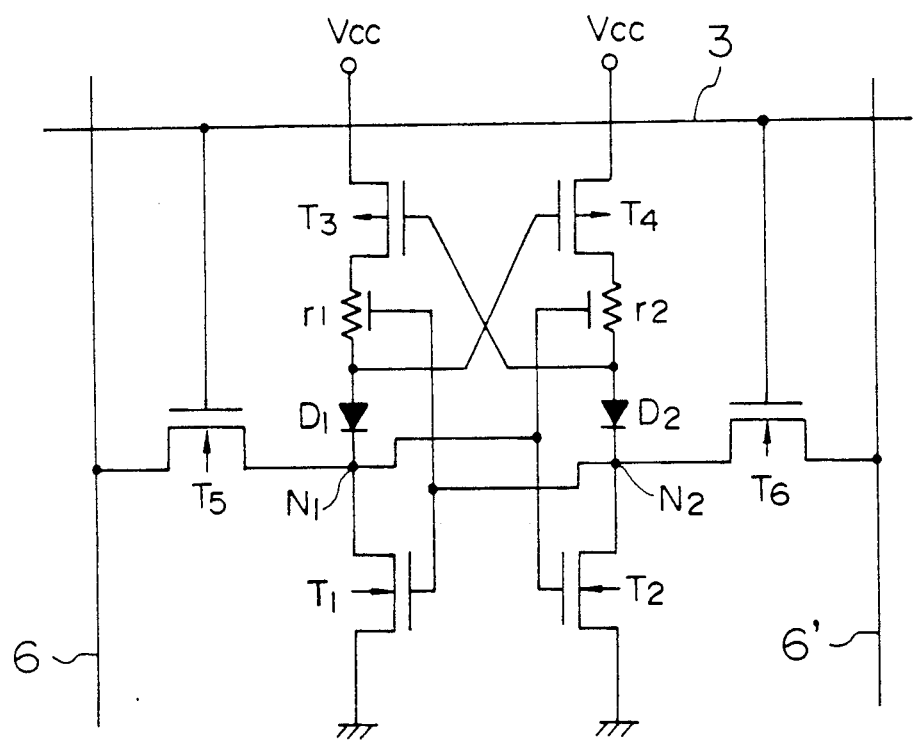

When the gate electrodes 25a and 25b of the P-channel load MOSFET's are formed of an N-type polysilicon film, the equivalent circuit of FIG. 3 is formed. That is, a Zener diode $D_1$ is formed between a P-channel load MOSFET $T_3$ and an N-channel drive MOSFET $T_1$, and a Zener diode $D_2$ is formed between a P-channel load MOSFET $T_4$ and an N-channel MOSFET $T_2$. However, the formation of the Zener diodes $D_1$ and $D_2$ will not raise any trouble. Meanwhile, in a case where the gate electrodes 25a and 25b are formed of a P-type polysilicon film, the equivalent of FIG. 4 is obtained. The equivalent circuit of FIG. 3 is different from that of FIG. 4 in gate connection of each load MOSFET. That is, in the equivalent circuit of FIG. 3, the gate electrode of each load MOSFET is connected to the gate electrode of one of the drive MOSFET's $T_1$ and $T_2$, and is also connected to the drain region of the other drive MOSFET. Meanwhile, in the equivalent circuit of FIG. 4, the gate electrode of the load MOSFET $T_3$ is connected to the connecting point of the Zener diode $D_2$ and a variable resistor $r_2$, and the gate electrode of the load MOSFET $T_4$ is connected to the connecting point of the Zener diode $D_1$ and a variable resistor $r_1$.

Next, a method of fabricating the present embodiment will be explained, with reference to FIGS. 5A to 5F. All the MOSFET's which are formed in the silicon substrate 28 to construct the present embodiment (that is, a memory cell), are N-channel MOSFET's formed in the P-type well 29, and the peripheral circuit of the memory cell is usually formed of a CMOS circuit using a twin well. However, the peripheral circuit may be formed by using a single well (that is, N- or P-type well). Although only the method of fabricating the present embodiment is explained in the following description, the CMOS circuit for forming the peripheral circuit can be constructed by a conventional method.

Figure 5A:
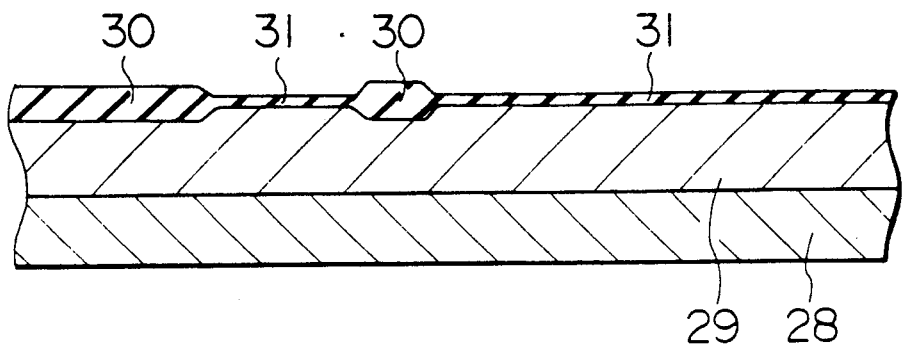
Figure 5B:
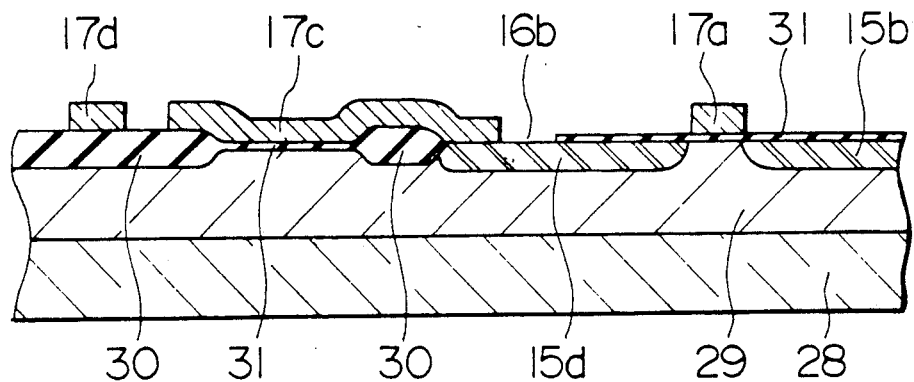
Figure 5C:
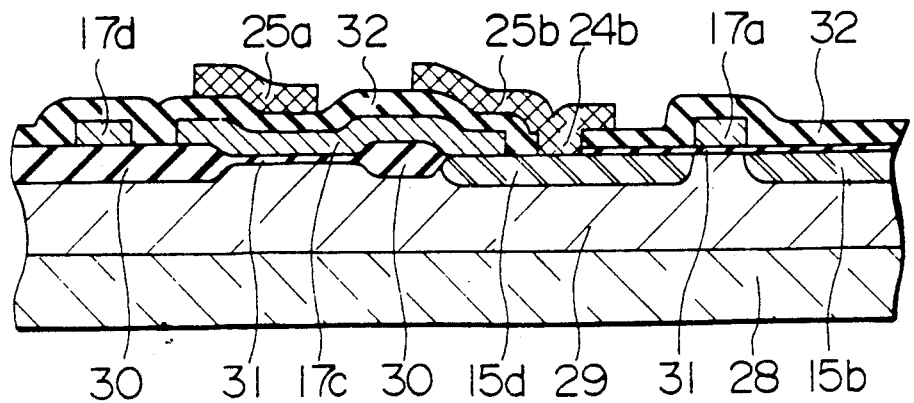
Figure 5D:
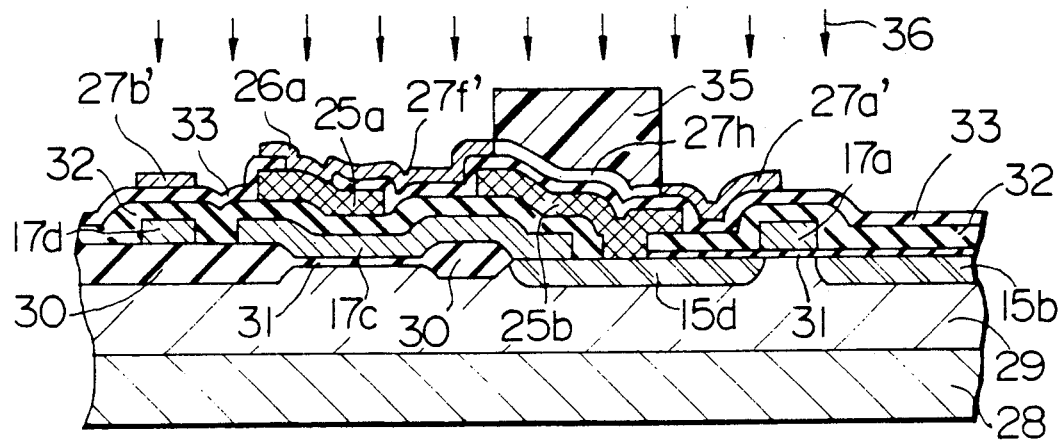
Figure 5E:
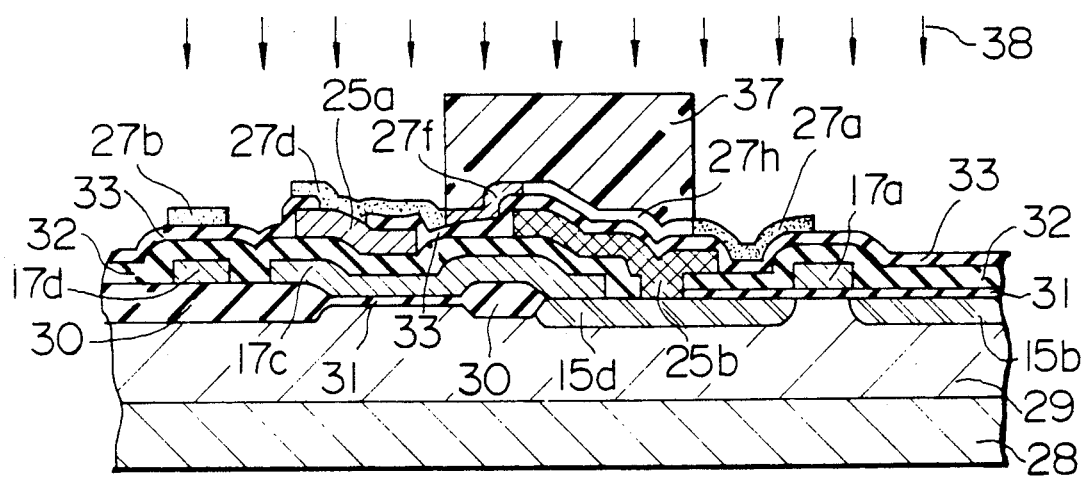

Referring to FIG. 5A, the P-type well 29 having an impurity concentration of $10^{16}$ to $10^{18}$ cm$^{-3}$ and a depth of 1 to 5 $\mu$m is formed in the N-type silicon substrate 28 having a resistivity of about 10 $\Omega$cm, in such a manner that a portion of the substrate 28 is doped with boron by the ion implantation method and thermal diffusion method. Then, a field oxide film 30 made of silicon oxide for separating circuit elements is grown to a thickness of 100 to 1,000 nm by the LOCOS (local oxidation of silicon) method, and a gate oxide film 31 having a thickness of 10 to 30 nm is formed on a surface region which is used as the active region of an MOSFET. Alternately, a silicon nitride film or the like is deposited in place of the oxide film 31 to form MISFET's. When the field oxide film 30 is formed, a channel stopper for preventing inversion layer formation is usually formed in that portion of the P-type well 29 which exists under the field oxide film 30. However, the channel stopper is omitted from the drawings for the sake of brevity. Next, as shown in FIG. 5B, the contact hole 16b is formed in the gate oxide film 31 by the wet etching method using a fluoric acid solution, and then a first polysilicon film is deposited by the LPCVD (low pressure chemical vapor deposition) method. The first polysilicon film thus obtained is doped with an N-type impurity such as phosphorus at an impurity concentration of $10^{19}$ to $10^{21}$ cm$^{-3}$ by the vapor phase diffusion method, and is then patterned by the photolithographic method and dry etching method so as to form the gate electrodes 17a, 17b and 17c. Thereafter, ion implantation is carried out while using the gate electrodes 17a, 17b and 17c as a mask. That is, an N-type impurity such as arsenic is implanted in the P-type well 29 at a dose of $10^{14}$ to $10^{16}$ cm$^{-2}$, and predetermined heat treatment is carried out to form the N-type regions 15b and 15c having a depth of 0.05 to 0.3 $\mu$m. Next, as shown in FIG. 5C, the silicon oxide film 32 is deposited to a thickness of 50 to 500 nm by the LPCVD method, and the contact hole 24b is formed in the silicon oxide film 32. Thereafter, a second polysilicon film is deposited, and then patterned by the photolithographic method and dry etching method so as to form the gate electrodes 25a and 25b of the P-channel MOSFET's. Next, as shown in FIG. 5D, the insulating film 33 made of silicon oxide or the like is deposited to a thickness of 5 to 50 nm by the LPCVD method, and predetermined heat treatment is carried out. Then, the contact hole 26a is formed in the insulating film 33, and a third polysilicon film is deposited to a thickness of 10 to 100 nm by the LPCVD method. The third polysilicon film is then patterned by the photolithographic method and dry etching method so that a portion which will be used as the source, drain, channel and resistive drain regions of a P-channel MOSFET, is left unremoved. Then, ion implantation is carried out while using a photoresist layer 35 as a mask. That is, BF$_2$ ions are implanted in a portion which will be used as the source, drain and resistive drain regions of the P-channel load MOSFET, at an implant energy of 15 to 50 KeV and at a dose of $1 \times 10^{13}$ to $1 \times 10^{15}$ cm$^{-2}$. The gate insulating film 33 of the P-channel MOSFET's may be an SiO$_2$ film which is obtained by thermally oxidizing the gate electrodes 25a and 25b formed of the second polysilicon film. Alternately, the gate insulating film 33 may be a silicon nitride (Si$_3$N$_4$) film or a composite film made up of an SiO$_2$ film and an Si$_3$N$_4$ film. That is, a P-channel MISFET can be used as a load FET. When ion implantation is carried out for the third polysilicon layer, it is preferable that an SiO$_2$ film having a thickness of 5 to 20 nm is present on the third polysilicon film. Next, as shown in FIG. 5E, ion implantation is carried out while using a photoresist layer 37 as a mask. That is, BF$_2$ ions are implanted in a portion which will be used as the source and drain regions of the P-channel MOSFET, at an implant energy of 15 to 50 KeV and at a dose of $1 \times 10^{14}$ to $5 \times 10^{15}$ cm$^{-2}$, and then predetermined heat treatment is carried out. Thus, the source region 27d, the drain region 27a and the channel region 27h of the P-channel MOSFET are formed. Further, the resistive drain region 27f is formed between the channel region 27h and the drain region 27a.

Figure 5F:
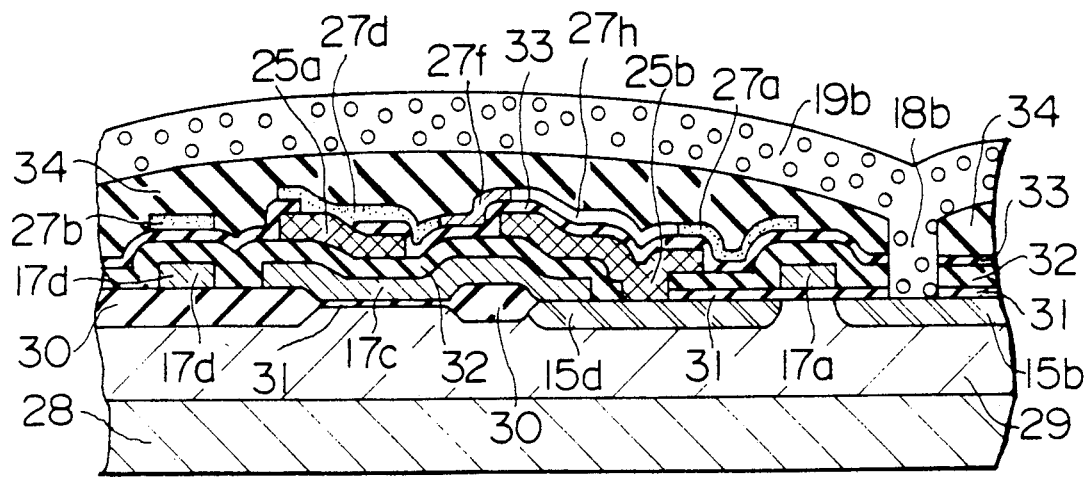

Next, as shown in FIG. 5F, an SiO$_2$ film having a thickness of 10 to 100 nm and a phosphorusdoped SiO$_2$ film 34 having a thickness of 100 to 1,000 nm are successively deposited by the CVD (chemical vapor deposition) method, and then an SOG (spin on glass) film having a thickness of 50 to 500 nm is applied to the surface by the spin coating method. Thereafter, predetermined heat treatment is carried out. Thus, the topology (that is, difference in level) in the surface of the memory cell is reduced. Then, the contact hole 18b is formed by the photolithographic method and dry etching method, and an aluminum film is deposited to a thickness of 0.1 to 2 $\mu$m by sputtering. The aluminum film thus obtained is patterned by the photolithographic method and dry etching method so as to form the aluminum electrode 19b.

According to the present embodiment, a capacitive element is formed between the gate electrode of a drive MOSFET and the gate electrode of a load MOSFET, and thus a static random access memory device can be obtained which is excellent in soft error immunity.

Further, according to the present embodiment, the gate electrode of a P-channel load MOSFET and the gate electrode of an N-channel drive MOSFET capable of exerting a field effect on the resistive drain region of the P-channel load MOSFET have the same potential. Thus, the driving capacity of the load MOSFET is enhanced, and the soft error immunity and retention characteristics in an operation period are improved.

Embodiment-2

Now, explanation will be made of a second embodiment of a static random access memory cell according to the present invention. The second embodiment is different from the first embodiment in that the source, drain and channel regions of each P-channel load MOSFET are formed in the second polysilicon film, and the gate electrode of each P-channel load MOSFET is formed of the third polysilicon film.

Figure 6:
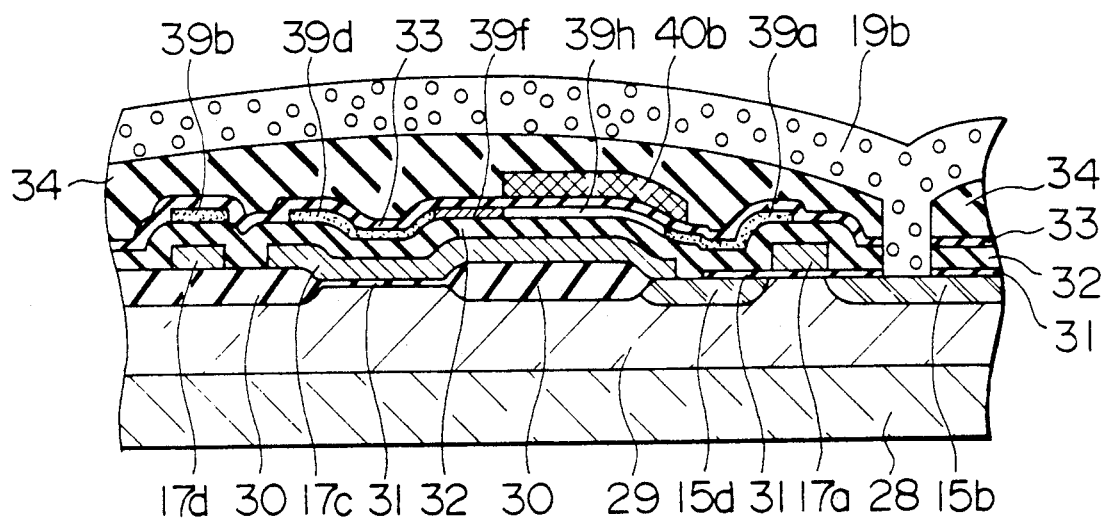

FIG. 6 is a sectional view showing the second embodiment. Referring to FIG. 6, a second polysilicon film is formed on the SiO₂ film 32 which is formed on N-channel drive MOSFET's and N-channel transfer MOSFET's, and the source region 39a, drain region 39d and channel region 39h of a P-channel load MOSFET are formed in the second polysilicon film. Further, a resistive drain region 39f is formed in the second polysilicon film so as to be sandwiched between the channel region 39h and the drain region 39d. A gate electrode 40b formed of a third polysilicon film is disposed over at least the channel region 39h in such a manner that the insulating film 33 is interposed between the gate electrode 40b and the channel region 39h. It is preferable that at least a portion of the channel region 39h is arranged over the gate electrode 17c of a drive MOSFET having the same potential as the potential of the gate electrode 40b.

According to the present embodiment, the source and drain regions of a P-channel load MOSFET can be formed in a self-aligned manner by carrying out ion implantation while using the gate electrode of the P-channel load MOSFET as a mask. Accordingly, a fabricating process is simplified, and a manufacturing cost is reduced. Further, since the source and drain regions of a P-channel load MOSFET are formed in a self-aligned manner, the area of the present embodiment (that is, memory cell) can be made as small as possible, and thus a multiplicity of present embodiments can be formed in an integrated circuit at a very high packing density. Further, the electrodes 40b and 17c act as the dual gate electrode of a P-channel load MOSFET, and thus the driving capacity thereof is greatly increased. Accordingly, the present embodiment is excellent in noise immunity.

Embodiment-3

Figure 7A:
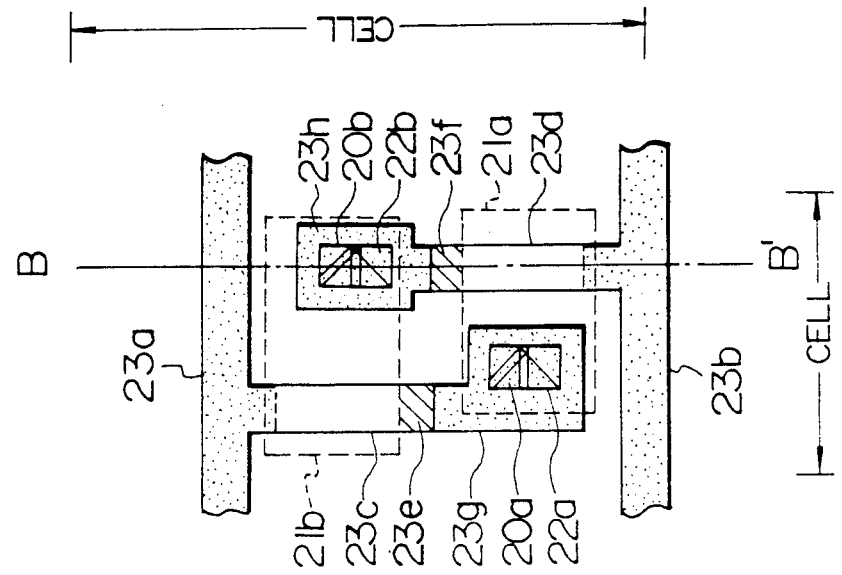
Figure 7B:
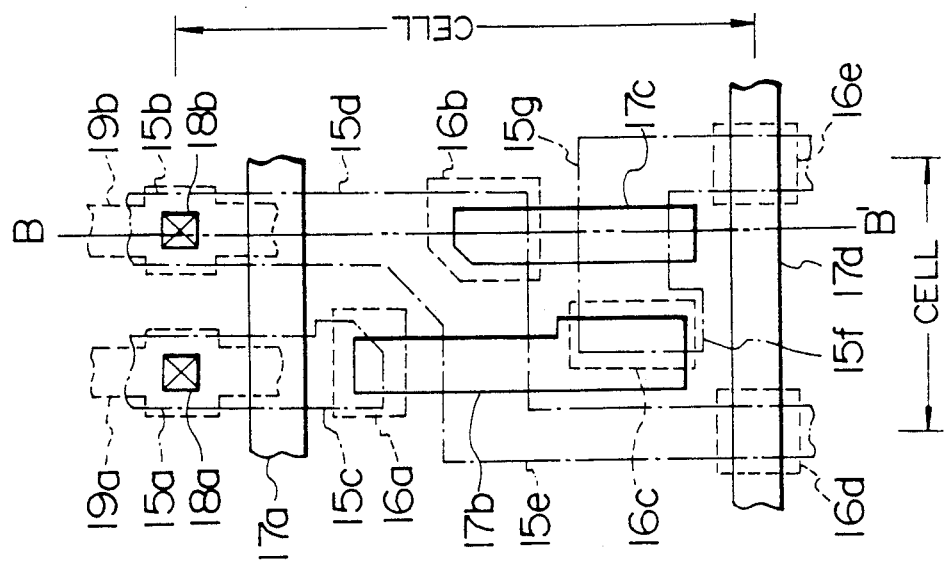
Figure 8:
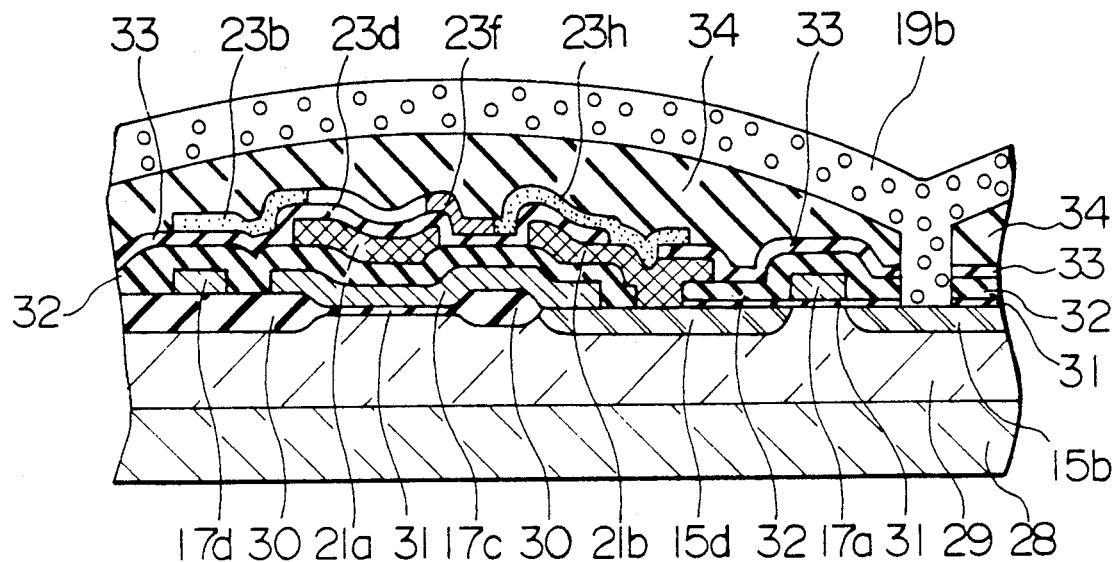
Figure 9:
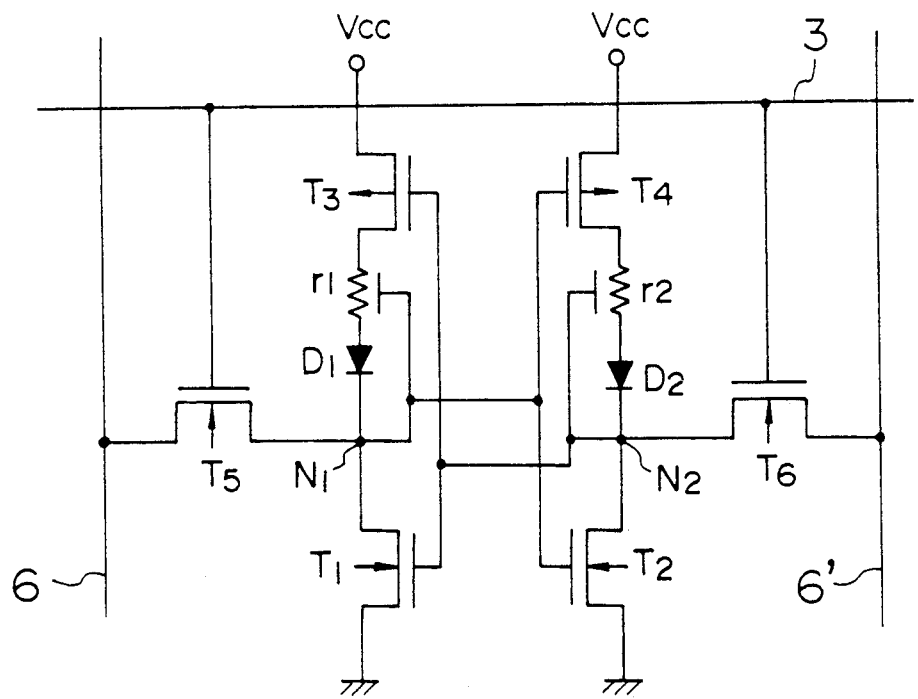
Figure 10:
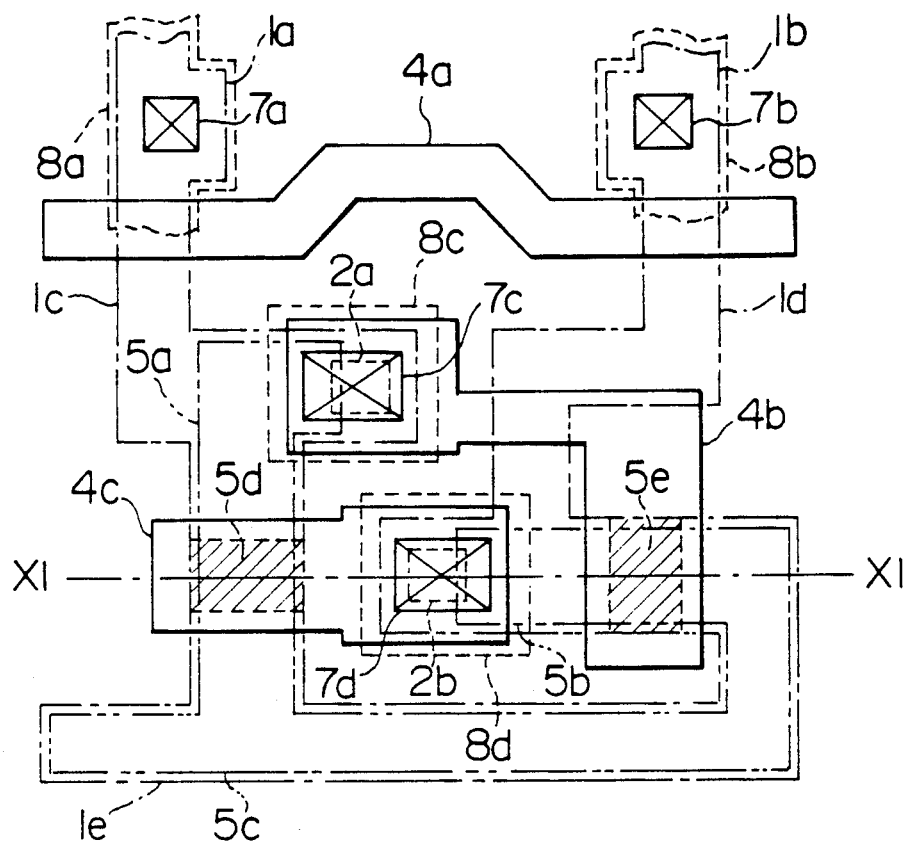
FIG. 10 is a plan view showing a conventional semiconductor memory cell.
Figure 11:
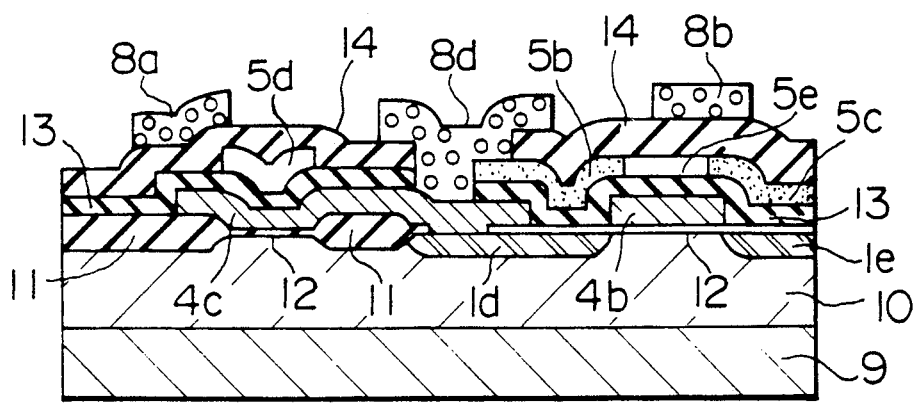
FIG. 11 is a sectional view taken along the line XI—XI of FIG. 10.
Figure 12:
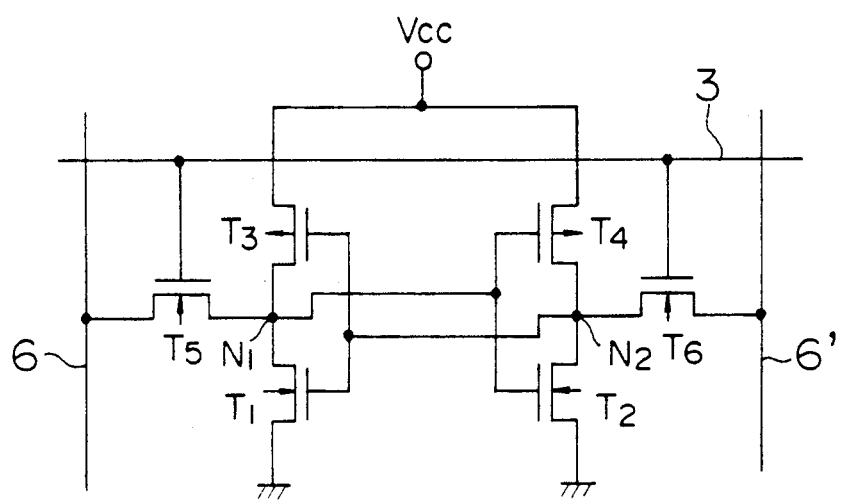
FIG. 12 is a circuit diagram showing the equivalent circuit of the memory cell of FIG. 10.

Next, explanation will be made of a third embodiment of a static random access memory cell according to the present invention which embodiment is different from the first embodiment in arrangement of resistive drain regions. FIGS. 7A and 7B are plan views showing the third embodiment, FIG. 8 is a sectional view taken along the line B-B' of FIGS. 7A and 7B, and FIG. 9 is a circuit diagram showing the equivalent circuit of the third embodiment. Referring to FIGS. 7A, 7B and 8, the resistive drain region 23f sandwiched between the drain region 23h and channel region 23d of a P-channel MOSFET is disposed over the gate electrode 17c of a drive MOSFET having the same potential as the potential of the drain region 23h, and thus the conductivity of the resistive drain region 23f is changed by a voltage applied to the gate electrode 17c. Similarly, the resistive drain region 23e sandwiched between the drain region 23g and channel region 23c of another P-channel MOSFET is disposed over the gate electrode 17b of another drive MOSFET having the same potential as the potential of the drain region 23g, and thus the conductivity of the resistive drain region 23e is changed by a voltage applied to the gate electrode 17b. Accordingly, as shown in the equivalent circuit of FIG. 9, a resistive element, the gate and drain of which are connected to each other, is connected to the drain region of a P-channel MOSFET.

According to the present embodiment, the resistive drain region of a P-channel MOSFET which is connected to a storage node having a high potential and is kept at an ON-state, is large in conductivity. Accordingly, the operation of the present embodiment is scarcely affected by the resistance of the above resistive drain region. That is, even when a supply voltage is reduced, there is no fear of reversing the information of the memory cell by the above resistance. Moreover, the resistive region can reduce the leakage current of the memory cell.

As has been explained in the foregoing, according to the present invention, there is provided a semiconductor device having a stacked CMIS structure, in which the source, drain and channel regions and gate electrode of a second MISFET of a second conductive type are formed over a first MOSFET of a first conductive type formed in a silicon substrate, and a resistive drain region is formed between the drain region and channel region of the second MOSFET so that the resistive drain region is disposed over the gate electrode of the first MOSFET. Accordingly, the conductivity of the second MOSFET can be increased by a voltage applied to the gate electrode of the first MOSFET. That is, the semiconductor device can be formed in a small area, can reduce a leakage current, and can operate on a low voltage. Specifically, according to the present invention, a static random access memory can be formed which is small in size and leakage current, can operate on a low voltage, and is excellent in immunity to the soft error due to α-rays.

It is further understood by those in the art that the foregoing description shows only preferred embodiments of the disclosed device and that various changes and modifications may be made in the present invention without departing from the spirit and scope thereof.

What is claimed is:

1. A semiconductor device comprising:
a semiconductor body;
a first MISFET of a first conductivity type formed in the semiconductor body; and
a second MISFET of a second conductive type formed on a first insulating film, the first insulating film being formed on the first MISFET, the second MISFET including a first conductive film, a second insulating film arranged and a second conductive film in such a manner that a laminate is formed of the first conductive film, the second insulating film and the second conductive film, the source, drain and channel regions of the second MISFET being formed in the first conductive film, a first resistive drain region being formed between the drain and channel regions of the first conductive film so that the first resistive drain region is lower in impurity concentration than the drain region, the gate insulating film of the second MISFET being formed of the second insulating film, and the gate electrode of the second MISFET being formed of the second conductive film.

2. A semiconductor device according to claim 1, wherein the first resistive drain region of the second MISFET is disposed over the gate electrode of the first MISFET.

3. A semiconductor device comprising:
a semiconductor body;

at least a pair of first MISFET's of a first conductivity type formed in the semiconductor body;

at least a pair of second MISFET's of the first conductivity type formed in the semiconductor body; and a third MISFET of a second conductivity type, a flip-flop circuit of the CMIS type being formed of the third MISFET's, to be used in a static random access memory cell, the third MISFET being formed over at least one of the first MISFET's with a first insulating film between the third and first MISFET's, the third MISFET including a first conductive film, a second insulating film and a second conductive film, the source, drain and channel regions of the third MISFET being formed in the first conductive film, a first resistive drain region being formed between the drain and channel regions of the first conductive film so that an impurity of the second conductivity type is contained in the first resistive drain region at a lower concentration than in the drain region, the gate insulating film of the third MISFET being formed of the second insulating film, and the gate electrode of the third MISFET being formed of the second conductive film.

4. A semiconductor device according to claim 3, wherein at least the first resistive drain region of the third MISFET is disposed over the gate electrode of one of the first MISFET's.

5. A semiconductor device according to claim 3, wherein the second conductive film is disposed over the first conductive film, and the second insulating film is interposed between the first and second conductive films.

6. A semiconductor device according to claim 3, wherein the first and second conductive films are made of polycrystalline silicon.

7. A semiconductor device according to claim 3, wherein the first MISFET's are used as drive MISFET's, the second MISFET's are used as transfer MISFET's, and the third MISFET is used as a load MISFET.

8. A semiconductor device according to claim 5, wherein at least the first resistive drain region of the third MISFET is disposed over the gate electrode of one of the first MISFET's.

9. A semconductor device according to claim 6, wherein the second conductive film is disposed over the first conductive film, and the second insulating film is interposed between the first and second conductive films.

10. A semiconductor device according to claim 8, wherein the first and second conductive films are made of polycrystalline silicon.

11. A semconductor device according to claim 10, wherein the first MISFET's are used as drive MISFET's, the second MISFET's are used as transfer MISFET's, and the third MISFET is used as a load MISFET.

12. A semiconductor device according to claim 3, wherein the semiconductor body is a well region formed in a semiconductor substrate.

13. A semiconductor device according to claim 12, wherein the second conductive film is disposed over the first conductive film, and the second insulating film is interposed between the first and second conductive films.

14. A semiconductor device according to claim 12, wherein the first and second conductive films are made of polycrystalline silicon.

15. A semiconductor device according to claim 12, wherein the first MISFET's are used as drive MISFET's, the second MISFET's are used as transfer MISFET's, and the third MISFET is used as a load MISFET.

16. A semiconductor device according to claim 13, wherein at least the first resistive drain region of the third MISFET is disposed over the gate electrode of one of the first MISFET's.

17. A semiconductor device according to claim 14, wherein the second conductive film is disposed over the first conductive film, and the second insulating film is interposed between the first and second conductive films.

18. A semiconductor device according to claim 16, wherein the first and second conductive films are made of polycrystalline silicon.

19. A semiconductor device according to claim 18, wherein the first MISFET's are used as drive MISFET's, the second MISFET's are used as transfer MISFET's, and the third MISFET is used as a load MISFET.

20. A semiconductor device according to claim 1, wherein the semiconductor body is a well region formed in a semiconductor substrate.

21. A semiconductor device comprising:
a semiconductor body;
at least a pair of first MISFET's of a first conductivity type formed in the semiconductor body;
at least a pair of second MISFET's of the first conductivity type formed in the semiconductor body; and
a third MISFET of a second conductivity type, a flip-flop circuit being formed of the first and third MISFET's, to be used in a static random access memory cell, the third MISFET being formed over at least one of the first MISFET's with a first insulating film between the third and first MISFET's, the third MISFET including a first conductive film, a second insulating film and a second conductive film, the source, drain and channel regions of the third MISFET being formed in the first conductive film, a first resistive drain region being formed between the drain and channel regions of the first conductive film so that the first resistive drain region is substantially undoped, the gate insulating film of the third MISFET being formed of the second insulating film, and the gate electrode of the third MISFET being formed of the second conductive film.

22. A semiconductor device according to claim 21, wherein at least the first resistive drain region of the first conductive film is disposed over the gate electrode of one of the first MISFET's.

23. A semiconductor device according to claim 21, wherein the second conductive film is disposed over the first conductive film, and the second insulating film is interposed between the first and second conductive films.

24. A semiconductor device according to claim 21, wherein the first and second conductive films are made of polycrystalline silicon.

25. A semiconductor device according to claim 21, wherein the first MISFET's are used as drive MISFET's, the second MISFET's are used as transfer MIS- FET's, and the third MISFET is used as a load MISFET.

26. A semiconductor device according to claim 23, wherein at least the first resistive drain region of the third MISFET is disposed over the gate electrode of one of the first MISFET's.

27. A semiconductor device according to claim 24, wherein the second conductive film is disposed over the first conductive film, and the second insulating film is interposed between the first and second insulating films.

28. A semiconductor device according to claim 26, wherein the first and second conductive films are made of polycrystalline silicon.

29. A semiconductor device according to claim 28, wherein the first MISFET's are used as drive MISFET's, the second MISFET's are used as transfer MISFET's, and the third MISFET is used as a load MISFET.

30. A semiconductor device according to claim 21, wherein the semiconductor body is a well region formed in a semiconductor substrate.

31. A semiconductor device according to claim 6, wherein the second conductive film is disposed over the first conductive film, at least the channel region of the third MISFET is disposed over the gate electrode of one of the first MISFET's, and the second insulating film is interposed between the first and second conductive films.

* * * * *